United States Patent
Chen et al.

(10) Patent No.: US 12,557,664 B2
(45) Date of Patent: Feb. 17, 2026

(54) ELECTRONIC PACKAGE AND FABRICATING METHOD THEREOF

(71) Applicant: AaltoSemi Inc., Nanjing (CN)

(72) Inventors: Min-Yao Chen, Nanjing (CN); Yin-Ju Chen, Nanjing (CN); Sung-Kun Lin, Nanjing (CN); Andrew C. Chang, Nanjing (CN)

(73) Assignee: AaltoSemi Inc., Nanjing (CN)

( * ) Notice: Subject to any disclaimer, the term of this patent is extended or adjusted under 35 U.S.C. 154(b) by 0 days.

(21) Appl. No.: 18/640,838

(22) Filed: Apr. 19, 2024

(65) Prior Publication Data

US 2025/0022723 A1 Jan. 16, 2025

(30) Foreign Application Priority Data

Jul. 13, 2023 (CN) .......................... 202310858951.1

(51) Int. Cl.

| | |
|---|---|
| *H01L 21/48* | (2006.01) |
| *H01L 23/13* | (2006.01) |
| *H01L 23/31* | (2006.01) |
| *H01L 23/498* | (2006.01) |
| *H01L 23/00* | (2006.01) |
| *H01L 25/065* | (2023.01) |
| *H01L 25/16* | (2023.01) |

(52) U.S. Cl.
CPC .......... *H01L 21/4857* (2013.01); *H01L 23/13* (2013.01); *H01L 23/3128* (2013.01); *H01L 23/49822* (2013.01); *H01L 23/49833* (2013.01); *H01L 24/16* (2013.01); *H01L 24/32* (2013.01); *H01L 24/73* (2013.01); *H01L 25/0657* (2013.01); *H01L 25/16* (2013.01); *H01L 2224/16227* (2013.01); *H01L 2224/32225* (2013.01); *H01L 2224/73204* (2013.01); *H01L 2225/06517* (2013.01); *H01L 2225/0652* (2013.01)

(58) Field of Classification Search
CPC . H01L 21/4857; H01L 23/13; H01L 23/3128; H01L 23/49822; H01L 23/49833; H01L 24/16; H01L 24/32; H01L 24/73; H01L 25/0657; H01L 25/16; H01L 2224/16227; H01L 2224/32225; H01L 2224/73204; H01L 2225/06517; H01L 2225/0652; H01L 21/4846; H01L 21/56; H01L 23/3157; H01L 23/49811; H01L 23/49838
See application file for complete search history.

(56) References Cited

U.S. PATENT DOCUMENTS

| | | |
|---|---|---|
| 2010/0237492 A1 | 9/2010 | Sasaki et al. |
| 2021/0134728 A1* | 5/2021 | Rubin ................ H01L 21/4853 |

* cited by examiner

*Primary Examiner* — Evan G Clinton
(74) *Attorney, Agent, or Firm* — Jose Cherson Weissbrot

(57) ABSTRACT

An electronic package is provided, in which a cover layer is embedded in a circuit structure to form a groove, and an electronic element is disposed on the cover layer in the groove. A cladding layer encapsulates the electronic element, and an external connection structure is disposed on the circuit structure and the cladding layer. Therefore, the electronic element is embedded in the groove, such that a thickness of the electronic package can be greatly reduced to meet the requirement of thinning.

2 Claims, 6 Drawing Sheets

ELECTRONIC PACKAGE AND FABRICATING METHOD THEREOF

CROSS-REFERENCE TO RELATED APPLICATION

This application claims the benefit of priority Chinese Patent Application No. 202310858951.1, filed Jul. 13, 2023, the entire contents of which are hereby incorporated by reference.

BACKGROUND

Technical Field

The present disclosure relates to a semiconductor package fabricating process, and more particularly, to an electronic package and a fabricating method thereof which can meet the thinning requirements.

Description of Related Art

With the evolution of semiconductor packaging technology, semiconductor devices have been developed in different packaging types, and in order to enhance the electrical function and save packaging space, multiple stacked package structures have been developed in the industry to form package-on-package (POP) package types, so as to present the heterogeneous integration characteristics of the system-in-package (SIP). Therefore, the stacking design achieves system integration, which is suitable for all kinds of thin, light and small electronic products.

FIG. 1 is a schematic cross-sectional view showing a conventional semiconductor package 1. As shown in FIG. 1, the semiconductor package 1 includes a semiconductor chip 10, a first package substrate 11, a second package substrate 12, a plurality of solder pillars 17 and a packaging gel 15. The first package substrate 11 has a core layer 110 and a plurality of circuit layers 111, and the second package substrate 12 has a core layer 120 and a plurality of circuit layers 121. The semiconductor chip 10 is disposed on the first package substrate 11 in a flip-chip manner via a plurality of conductive bumps 101, and an underfill 16 is formed between the semiconductor chip 10 and the first package substrate 11 to encapsulate the conductive bumps 101. In addition, a package module 1a is disposed on the second package substrate 12 via a plurality of solder balls 19. The solder pillars 17 are used to stack and electrically connect the circuit layer 111 of the first package substrate 11 to the circuit layer 121 of the second package substrate 12. The packaging gel 15 encapsulates the solder pillars 17 and the semiconductor chip 10.

However, in the conventional semiconductor package 1, the first package substrate 11 has the core layer 110 and the second package substrate 12 has the core layer 120, and the semiconductor chip 10 is located above the first package substrate 11, resulting in a significant increase in the thickness H of the semiconductor package 1, which does not meet the need for thinning.

Furthermore, the packaging gel 15 needs to cover all the surface areas on the upper side of the first package substrate 11 to encapsulate the solder pillars 17 and the semiconductor chip 10. Since it is not possible to reduce the amount of the packaging gel 15, it is difficult to reduce the fabricating cost.

Therefore, how to overcome the various problems of the above-mentioned prior art has become an urgent issue to be solved.

SUMMARY

In view of the various shortcomings of the aforementioned prior art, the present disclosure provides an electronic package, which comprises: a circuit structure having a first side and a second side opposing the first side, wherein the second side is formed with a groove thereon, wherein the circuit structure comprises at least one first dielectric layer and a first circuit layer formed on the first dielectric layer, and the first circuit layer has a plurality of electrical contact pads disposed in the groove and a cover layer covering the plurality of electrical contact pads, wherein the cover layer has a plurality of openings, and each of the plurality of openings exposes a portion of a surface of each of the plurality of electrical contact pads; an electronic element disposed on the cover layer in the groove and electrically connected to the plurality of electrical contact pads; a cladding layer formed on the cover layer and encapsulating the electronic element; and an external connection structure disposed on the second side of the circuit structure and the cladding layer, and the external connection structure comprising a second dielectric layer formed on the first dielectric layer and a second circuit layer bonded with the second dielectric layer and electrically connected to the first circuit layer.

The present disclosure further provides a method of fabricating an electronic package, and the method comprises: providing a coreless circuit structure, wherein the circuit structure has a first side and a second side opposing the first side, and a groove is formed on the second side, wherein the circuit structure comprises at least one first dielectric layer and a first circuit layer formed on the first dielectric layer, and the first circuit layer has a plurality of electrical contact pads disposed in the groove and a cover layer covering the plurality of electrical contact pads, wherein the cover layer has a plurality of openings, and each of the plurality of openings exposes a portion of a surface of each of the plurality of electrical contact pads; disposing an electronic element on the cover layer in the groove to electrically connect to the plurality of electrical contact pads; forming a cladding layer on the cover layer to encapsulate the electronic element; and configuring and disposing an external connection structure on the second side of the circuit structure and the cladding layer, wherein the external connection structure comprises a second dielectric layer formed on the first dielectric layer and a second circuit layer bonded with the second dielectric layer and electrically connected to the first circuit layer.

In the aforementioned electronic package and method, the external connection structure is stacked on the second side of the circuit structure and the cladding layer via a plurality of conductive elements.

In the aforementioned electronic package and method, the external connection structure is in contact with and bonded to the second side of the circuit structure and the cladding layer.

In the aforementioned electronic package and method, the present disclosure further comprises forming an insulating protective layer on the circuit structure and the cladding layer.

In the aforementioned electronic package and method, the present disclosure further comprises forming an insulating protective layer on the external connection structure.

In view of the above, in the electronic package and the fabricating method thereof of the present disclosure, the electronic element is buried via the groove, such that the thickness of the electronic package can be greatly reduced.

Therefore, the electronic package of the present disclosure can meet the requirement of thinning compared with the prior art.

Furthermore, the cladding layer only needs to be formed on the cover layer without covering all the surface areas of the second side of the circuit structure. As such, compared with the prior art, the electronic package of the present disclosure can reduce the amount of the cladding layer so as to reduce the fabricating cost.

DETAILED DESCRIPTION

The following describes the implementation of the present disclosure with examples. Those skilled in the art can easily understand other advantages and effects of the present disclosure from the content disclosed in this specification.

It should be understood that the structures, ratios, sizes, and the like in the accompanying figures are used for illustrative purposes to facilitate the perusal and comprehension of the content disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical content disclosed in the present specification. Meanwhile, terms such as "above," "on," "first," "second," "a," "one" and the like are merely used for clear explanation rather than limiting the practicable scope of the present disclosure, and thus, alterations or adjustments of the relative relationships thereof without essentially altering the technical content should still be considered in the practicable scope of the present disclosure.

FIG. 2A to FIG. 2G are schematic cross-sectional views showing a method of fabricating an electronic package 2 according to a first embodiment of the present disclosure.

Figure 1:
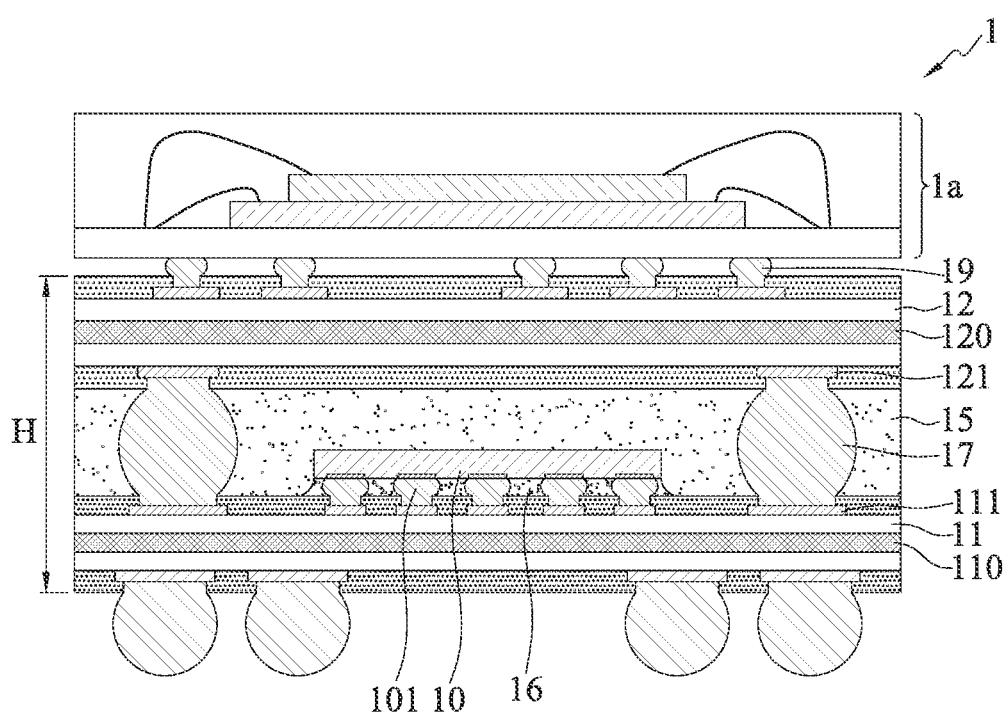
FIG. 1 is a schematic cross-sectional view showing an exemplary method of fabricating a conventional semiconductor package.
Figure 2A:
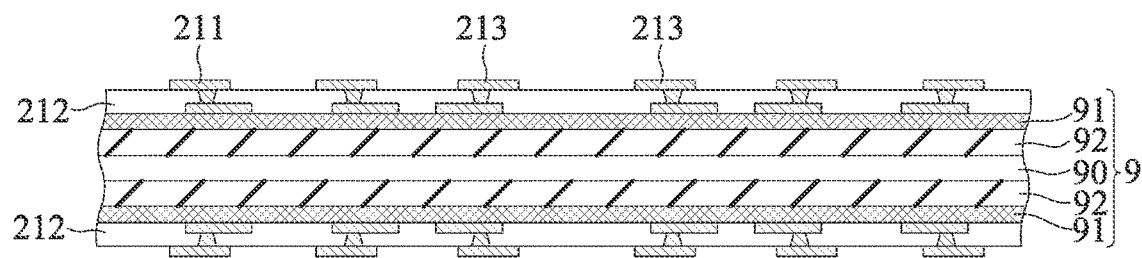
FIG. 2A to FIG. 2G are schematic cross-sectional views showing an exemplary method of fabricating an electronic package according to a first embodiment of the present disclosure.

As shown in FIG. 2A, a carrier 9 is provided with a first dielectric layer 212 symmetrically formed on each of two opposite sides of the carrier 9 and a first circuit layer 211 formed on the first dielectric layer 212.

In an embodiment, the carrier 9 is a temporary carrier plate, which may be a plate having a metal layer on both opposite sides, such as a copper foil substrate. A metal layer 92 is formed on each of the two opposite surfaces of a board 90 of the carrier 9, and a seed layer 91 is formed on the metal layer 92.

Moreover, the first circuit layer 211 is of a redistribution layer (RDL) specification and has a plurality of electrical contact pads 213. For example, by means of the seed layer 91, the first circuit layer 211 may be fabricated by electroplating metal (such as copper) or other manners. The line width/spacing (L/S) of the first circuit layer 211 is about 10/10 micrometers (μm).

Also, the material for forming the first dielectric layer 212 is a dielectric material such as polybenzoxazole (PBO), polyimide (PI), prepreg (PP) with glass fibers, or others. For example, the first dielectric layer 212 may be made of PP with a coefficient of thermal expansion (CTE) of 10 ppm/° C.

Figure 2B:
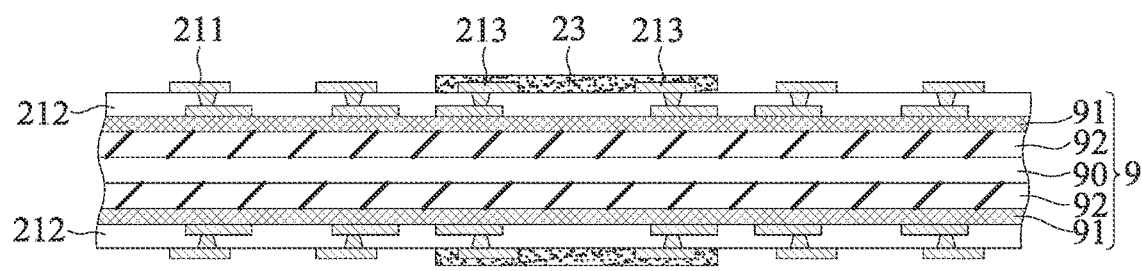

As shown in FIG. 2B, a cover layer 23 is formed on the first dielectric layer 212, such that the cover layer 23 covers the electrical contact pads 213.

In an embodiment, the cover layer 23 is a thin film, which may be made of a dielectric material such as polybenzoxazole (PBO), polyimide (PI), prepreg (PP) with glass fibers, or others. For example, the cover layer 23 may be made of a PI film with a CTE of 40 ppm/° C., and glass transition temperature (Tg) of the cover layer 23 is higher than the Tg of the first dielectric layer 212 (PP material). It should be understood that the material for forming the cover layer 23 is different from the material for forming the first dielectric layer 212.

Figure 2C:
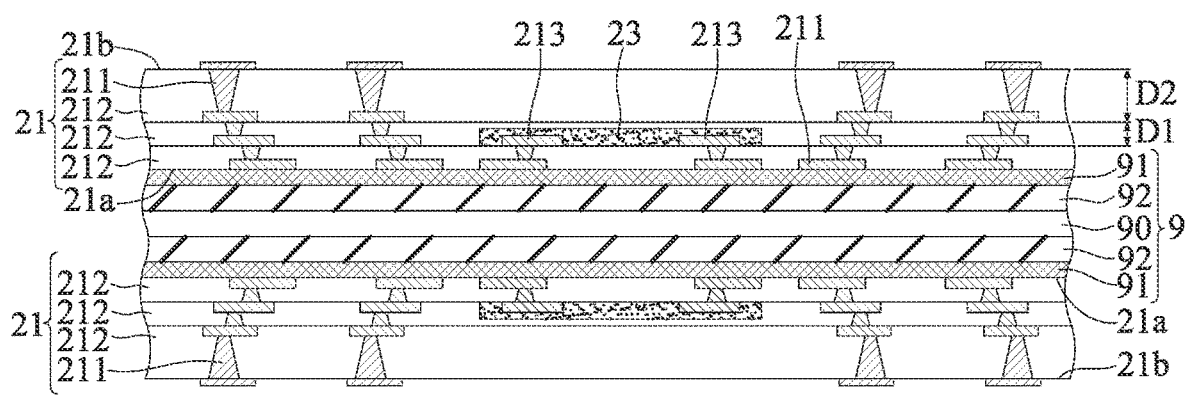

As shown in FIG. 2C, a build-up process is carried out on the first dielectric layer 212 and the cover layer 23 to form a circuit structure 21, such that the cover layer 23 is embedded in the first dielectric layer 212 of the circuit structure 21.

In an embodiment, the circuit structure 21 includes a plurality of first dielectric layers 212 and a plurality of first circuit layers 211 formed on each of the first dielectric layers 212, such that portions of the first circuit layers 211 of the circuit structure 21 are exposed from the first dielectric layer 212 on a second side 21b of the circuit structure 21.

Moreover, each of the circuit structures 21 is coreless and is defined with a first side 21a and a second side 21b opposing the first side 21a. In addition, the first side 21a of the circuit structure 21 is bonded onto the seed layer 91.

Further, the first circuit layer 211 and other conductive materials are not formed on each of the first dielectric layers 212 corresponding to the cover layer 23, and thus there may be a problem of uneven distribution of stress. However, since the material used to form the cover layer 23 is different from the material used to form the first dielectric layer 212, the stress can be distributed to avoid the problem of delamination during the build-up process.

In addition, the thicknesses D1, D2 of the first dielectric layers 212 may not be the same. For example, the thickness D1 of each of the inner two first dielectric layers 212 is 25 micrometers, and the thickness D2 of the outermost first dielectric layer 212 is 50 micrometers.

It should be understood that by utilizing the build-up process, the circuit structures 21 may be designed with the number of layers of the first dielectric layer 212 as required to fabricate the desired number of layers of the first circuit layer 211.

Figure 2D:
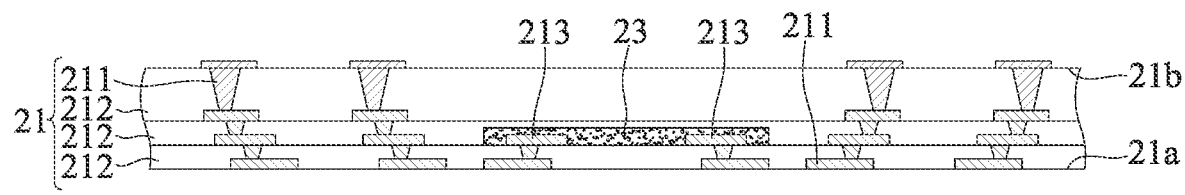
Figure 2D:
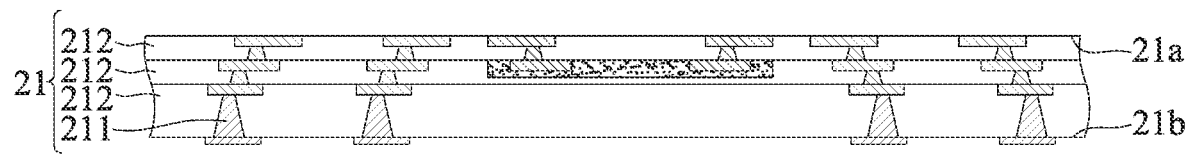

As shown in FIG. 2D, the board 90 as well as the metal layer 92 and the seed layer 91 thereon are removed to expose the first side 21a of the circuit structure 21.

Figure 2E:
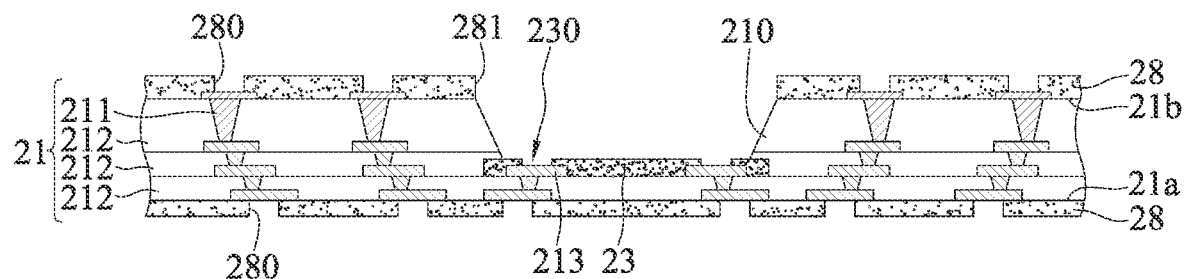

As shown in FIG. 2E, an insulating protective layer 28 made of such as a solder-resist material is formed on the first side 21a and the second side 21b of the circuit structure 21, and the insulating protective layer 28 has a plurality of apertures 280 exposing the first circuit layer 211, such that the insulating protective layer 28 forms a hollow region 281 exposing the first dielectric layer 212 on the second side 21b of the circuit structure 21 corresponding to the cover layer 23. Subsequently, a portion of the material of the first dielectric layer 212 between the hollow region 281 and the cover layer 23 is removed to form a groove 210 exposing the cover layer 23. As shown in FIG. 2E, the cover layer 23 is formed in the groove 210 and covers the plurality of electrical contact pads 213.

In an embodiment, the apertures 280 and the hollow region 281 may be formed in the insulating protective layer 28 by exposure and development, and the first dielectric layer 212 may be removed by laser or milling to form the groove 210. For example, the cover layer 23 may be used as a stop layer to prevent the laser from burning the electrical contact pads 213.

Further, a plurality of openings 230 exposing the electrical contact pads 213 may be formed on the cover layer 23. For example, the openings 230 may be formed by laser or other means.

It should be understood that since the outermost first dielectric layer 212 is used to make the groove 210, the thickness D2 of the outermost first dielectric layer 212 is greater than the thickness D1 of the other first dielectric layers 212 (which do not form the groove 210).

Figure 2F:
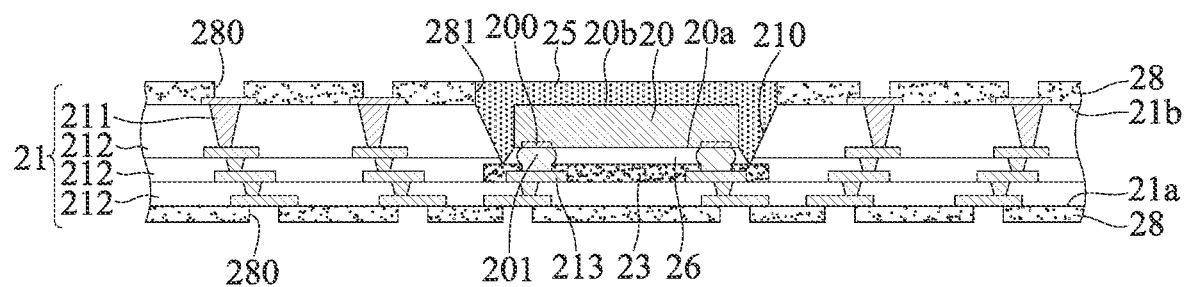

As shown in FIG. 2F, at least one electronic element 20 is disposed in the groove 210, and a cladding layer 25 is formed on the cover layer 23, such that the cladding layer 25 covers the electronic element 20.

In an embodiment, the electronic element 20 is an active element, a passive element, or a combination of the active element and the passive element, wherein the active element is, for example, a semiconductor chip, and the passive element is, for example, a resistor, a capacitor, or an inductor. For example, the electronic element 20 is a semiconductor chip and has an active surface 20a and an inactive surface 20b opposing the active surface 20a. A plurality of electrode pads 200 are formed on the active surface 20a, so that the electrode pads 200 of the active surface 20a of the electronic element 20 are electrically connected to the electrical contact pads 213 via a plurality of conductive bumps 201 made of solder material (such as solder paste or solder balls) in a flip-chip manner, and the conductive bumps 201 are then encapsulated with an underfill 26. Alternatively, the inactive surface 20b of the electronic element 20 may be placed on the cover layer 23, and the electrode pads 200 are electrically connected to the electrical contact pads 213 via a plurality of bonding wires such as gold wires or copper wires in a wire bonding manner. It should be understood that the cover layer 23 may be used as a solder-resist layer to facilitate back-soldering (reflow) of the conductive bumps 201 or soldering of the bonding wires, and the electronic element 20 can be electrically connected to the electrical contact pads 213 in a variety of ways that are not limited to the above.

Moreover, the cladding layer 25 is made of an insulating material, such as polyimide (PI), dry film, epoxy resin packaging gel or epoxy resin molding compound (EMC), and the cladding layer 25 can be formed on the cover layer 23 by lamination or molding. For example, the cladding layer 25 may be made of an epoxy resin molding compound (EMC) with a coefficient of thermal expansion (CTE) of 10 ppm/° C. to 25 ppm/° C.

Furthermore, the cladding layer 25 is filled into the groove 210 and the hollow region 281, and a portion of the material of the cladding layer 25 may be removed by a leveling process, such as an etching or grinding process, such that the surface of the upper side of the cladding layer 25 is flush with the surface of the insulating protective layer 28. For example, the cladding layer 25 covers the electronic element 20 and the underfill 26, and the cladding layer 25 covers the inactive surface 20b of the electronic element 20, such that the electronic element 20 is not exposed from the cladding layer 25.

Figure 2G:
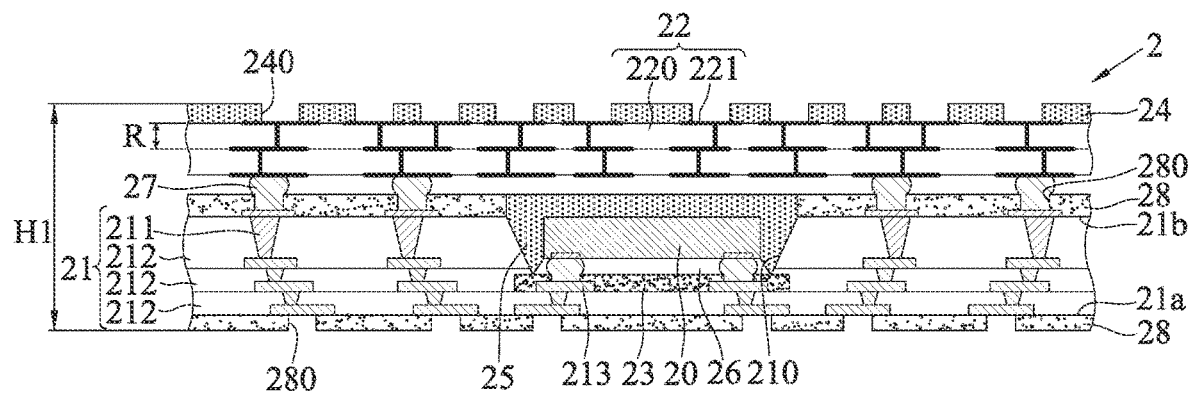

As shown in FIG. 2G, an external connection structure 22 is formed on the cladding layer 25 and the insulating protective layer 28 to form the electronic package 2.

In an embodiment, the external connection structure 22 is in the form of a circuit board and is stacked on the circuit structure 21 via a plurality of conductive elements 27 made of such as solder materials (solder paste or solder balls). For example, the external connection structure 22 is a coreless package substrate. It should be understood that the circuit board can have various types and is not limited to the above.

Moreover, the external connection structure 22 includes at least a second dielectric layer 220 and a second circuit layer 221 bonded to the second dielectric layer 220, such that the second circuit layer 221 is electrically connected to the first circuit layer 211 in the apertures 280 via the conductive elements 27. For example, the second circuit layer 221 is of a redistribution layer (RDL) specification for making a circuit layer with fine lines and fine spacing, such as a line width/spacing (L/S) of 6/6 micrometers or 6/8 micrometers, and the second dielectric layer 220 is an Ajinomoto build-up film (ABF) made of dielectric material and has a CTE of 13 ppm/° C. to 17 ppm/° C.

Also, the thickness R of each of the second dielectric layers 220 is 10 micrometers to 20 micrometers, which is less than the thicknesses D1, D2 of the first dielectric layers 212.

In addition, a photosensitive (PS) PI material or a photo imageable coverlay (PICL) material can be used as a solder-resist material to form an insulating protective layer 24 on the outermost second dielectric layer 220 of the external connection structure 22, and a plurality of apertures 240 exposing the second circuit layer 221 may be formed for a plurality of solder balls 29 to be bonded onto the exposed surfaces of the second circuit layer 221. In the subsequent process, as shown in FIG. 2H, the external connection structure 22 can be connected to an electronic device 30 such as a package module, a semiconductor chip, or other functional elements via the solder balls 29.

Figure 2H:
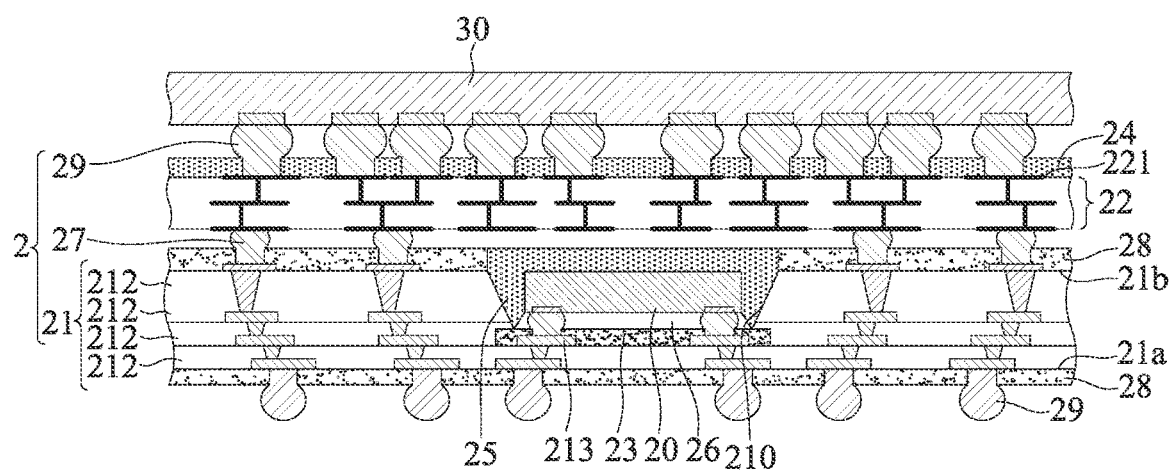
FIG. 2H is a schematic cross-sectional view showing an exemplary subsequent process of FIG. 2G.

It should be understood that the exposed surfaces of the first circuit layer 211 on the first side 21a of the circuit structure 21 may also be bonded to a plurality of solder balls 29, as shown in FIG. 2H, so that the electronic package 2 can be mounted on a circuit board (not shown).

Therefore, according to an embodiment of the present disclosure, the fabricating method mainly utilizes the design of the groove 210 to bury the electronic element 20, such that the thickness H1 of the electronic package 2 is greatly reduced, and thus the electronic package 2 in the embodiment of the present disclosure can meet the demand for thinning compared to the prior art.

Moreover, the cladding layer 25 only needs to be formed on the cover layer 23 and does not need to cover all the surface areas of the second side 21b of the circuit structure 21. As such, compared to the prior art, the electronic package 2 in the embodiment of the present disclosure can reduce the amount of the cladding layer 25 to reduce the fabricating cost.

Also, according to an embodiment of the present disclosure, a pre-fabricated external connection structure 22 is used in the fabricating method, such that after the formation of the cladding layer 25, the external connection structure 22 can be directly connected onto the second side 21b of the circuit structure 21 to effectively simplify the fabricating process.

In addition, the configuration of the CTE of the various wiring layers of the electronic package 2 is set in a gradual increase or gradual decrease manner. That is, the CTE of the first dielectric layer 212 (PP) is less than the CTE of the second dielectric layer 220 (ABF), in order to avoid excessive change in the CTE between the first side 21a of the circuit structure 21 and the external connection structure 22 by means of the configuration of the cladding layer 25 and the cover layer 23 with a larger CTE. Hence, compared to the prior art, after the electronic package 2 undergoes a number of environmental temperature change processes, the cladding layer 25 and the cover layer 23 can act as a stress-strengthening structure to effectively prevent the electronic package 2 from deforming and warping, thereby preventing the solder balls 29 from being misaligned, detached, or cracked.

Figure 3A:
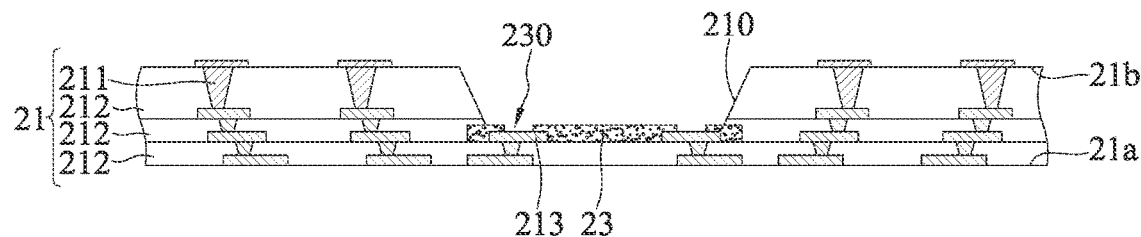
FIG. 3A to FIG. 3C are schematic cross-sectional views showing an exemplary method of fabricating an electronic package according to a second embodiment of the present disclosure.
Figure 3B:
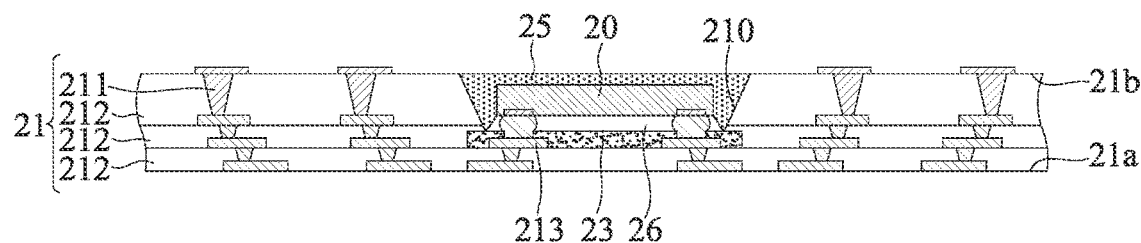
Figure 3C:
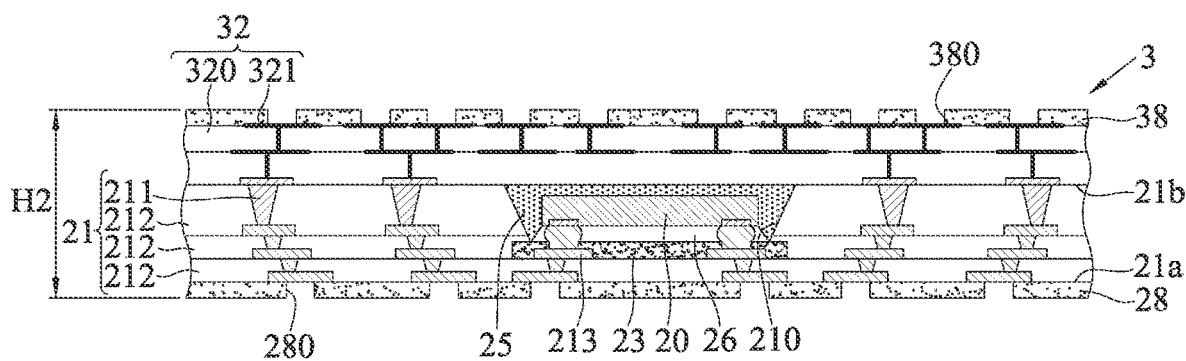

FIG. 3A to FIG. 3C are schematic cross-sectional views showing a method of fabricating an electronic package 3 according to a second embodiment of the present disclosure. The difference between the second embodiment and the first embodiment lies in the form of the external connection structure, and the other processes are generally the same. Therefore, the following is not going to repeat the similarities between the first and second embodiments.

As shown in FIG. 3A, continuing the process shown in FIG. 2D, after removing the board 90 and the metal layer 92 and the seed layer 91 thereon, a portion of the material of the first dielectric layer 212 on the cover layer 23 is removed to form a groove 210 that exposes the cover layer 23.

In an embodiment, the insulating protective layer 28 is temporarily not formed on the first side 21a and the second side 21b of the circuit structure 21.

As shown in FIG. 3B, at least one electronic element 20 is accommodated in the groove 210, and a cladding layer 25 is subsequently formed on the cover layer 23, such that the cladding layer 25 covers the electronic element 20.

In an embodiment, the cladding layer 25 only fills in the groove 210, and a portion of the material of the cladding layer 25 may be removed by a leveling process, such as an etching or grinding process, such that the surface of the upper side of the cladding layer 25 is flush with the surface of the first dielectric layer 212. For example, the cladding layer 25 does not cover the first circuit layer 211 on the second side 21b.

As shown in FIG. 3C, an external connection structure 32 is formed on the cladding layer 25 and the second side 21b of the circuit structure 21 to form another electronic package 3.

In an embodiment, the external connection structure 32 is in a build-up manner and is directly bonded onto the first dielectric layer 212 of the second side 21b of the circuit structure 21 via a second dielectric layer 320, and a second circuit layer 321 is directly electrically connected to the first circuit layer 211 of the second side 21b of the circuit structure 21.

Figure 3D:
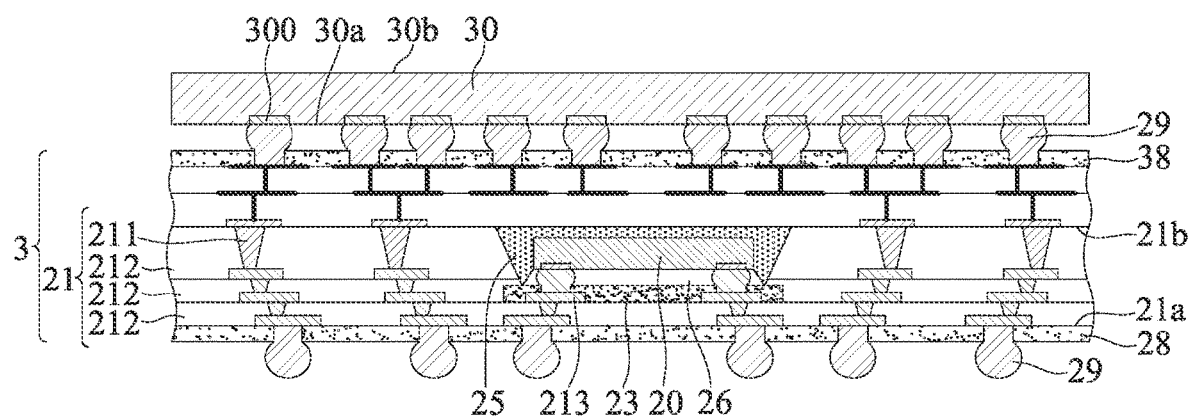
FIG. 3D is a schematic cross-sectional view showing an exemplary subsequent process of FIG. 3C.

Moreover, an insulating protective layer 28 and an insulating protective layer 38 made of such as a solder-resist material may be formed on the first side 21a of the circuit structure 21 and on the external connection structure 32, respectively, and the insulating protective layers 28, 38 have a plurality of apertures 280, 380 respectively exposing the first circuit layer 211 and the second circuit layer 321 to be bonded to the solder balls 29, wherein the insulating protective layer 38 on the external connection structure 32 may be made of a photosensitive polyimide (PSPI) material or a photo imageable coverlay (PICL) material. For example, in the subsequent process, as shown in FIG. 3D, the external connection structure 32 may be bonded to electrode pads 300 of the electronic device 30 on an active surface 30a opposite to an inactive surface 30b by means of the solder balls 29, and the electronic package 3 may be bonded onto a circuit board (not shown) via the solder balls 29 on the first side 21a of the circuit structure 21.

Therefore, according to the embodiment of the present disclosure, the fabricating method mainly utilizes the design of the groove 210 to bury the electronic element 20, and the external connection structure 32 is directly bonded onto the circuit structure 21 without the use of the conductive elements 27, so that the thickness H2 of the electronic package 3 can be reduced. Consequently, the electronic package 3 in the embodiment of the present disclosure can better meet the need for thinning compared to the prior art.

In addition, the cladding layer 25 only needs to be formed on the cover layer 23, and does not need to cover all the surface areas of the second side 21b of the circuit structure 21. Hence, compared with the prior art, the electronic package 2 in the embodiment of the present disclosure can reduce the amount of the cladding layer 25 so as to reduce the fabricating cost.

In addition, the configuration of the CTE of the various wiring layers of the electronic package 3 is set in a gradual increase or gradual decrease manner. That is, the CTE of the first dielectric layer 212 (PP) is less than the CTE of the second dielectric layer 320 (ABF), in order to avoid excessive change in the CTE between the first side 21a of the circuit structure 21 and the external connection structure 32 by means of the configuration of the cladding layer 25 and the cover layer 23 with a larger CTE. Hence, compared to the prior art, after the electronic package 3 undergoes a number of environmental temperature change processes, the cladding layer 25 and the cover layer 23 can act as a stress-strengthening structure to effectively prevent the electronic package 3 from deforming and warping, thereby preventing the solder balls 29 from being misaligned, detached, or cracked.

The present disclosure also provides an electronic package 2, which comprises: a circuit structure 21, at least one electronic element 20, a cladding layer 25 and an external connection structure 22.

The circuit structure 21 has a first side 21a and a second side 21b opposing the first side 21a, and a groove 210 is formed on the second side 21b, wherein the circuit structure 21 includes at least one first dielectric layer 212 and a first circuit layer 211 formed on the first dielectric layer 212, and the first circuit layer 211 has a plurality of electrical contact pads 213 disposed in the groove 210 and a cover layer 23 covering the plurality of electrical contact pads 213, wherein the cover layer 23 has a plurality of openings 230, and each of the plurality of openings 230 exposes a portion of the surface of each of the electrical contact pads 213.

The electronic element 20 is disposed on the cover layer 23 in the groove 210 and is electrically connected to the plurality of electrical contact pads 213.

The cladding layer 25 is formed on the cover layer 23 and covers the electronic element 20.

The external connection structure 22 is disposed on the second side 21b of the circuit structure 21 and the cladding layer 25, wherein the external connection structure 22 includes a second dielectric layer 220 formed on the first dielectric layer 212 and a second circuit layer 221 bonded with the second dielectric layer 220 and electrically connected to the first circuit layer 211.

In an embodiment, the external connection structure 22 is stacked on the second side 21b of the circuit structure 21 and the cladding layer 25 via a plurality of conductive elements 27.

In an embodiment, the external connection structure 22 is in contact with and bonded to the second side 21b of the circuit structure 21 and the cladding layer 25.

In an embodiment, the electronic package 2 further comprises an insulating protective layer 28 formed on the circuit structure 21 and the cladding layer 25.

In an embodiment, the electronic package 2, 3 further comprises an insulating protective layer 24, 38 formed on the external connection structure 22.

In summary, the aforementioned electronic package and the fabricating method thereof of the present disclosure can significantly reduce the thickness of the electronic package by means of the design of the groove to bury the electronic element. Hence, the electronic package of the present disclosure can meet the need for thinning. Further, by adopting a coreless design for the circuit structure and the external connection structure, it is also advantageous for thinning the electronic package.

Furthermore, the cladding layer only needs to be formed on the cover layer and does not need to cover all the surface areas of the second side of the circuit structure. As a result, the electronic package of the present disclosure can reduce the amount of the cladding layer to reduce the fabricating cost.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
a coreless circuit structure having a first side and a second side;
a groove defined on the second side of the coreless circuit structure, wherein the second side is placed opposite to the first side, wherein the coreless circuit structure comprises: a plurality of first dielectric layers with a plurality of first circuit layers;
an external connection structure disposed on the second side of the coreless circuit structure, wherein the external connection structure comprises a second dielectric layer with a plurality of second circuit layers;
wherein the plurality of first dielectric layers comprises a third dielectric layer on the second side, a fourth dielectric layer, and a fifth dielectric layer on the first side, which are sequentially bonded; among the second, third, fourth, and fifth dielectric layers, the third dielectric layer is the thickest among the third dielectric layer, the fourth dielectric layer and the fifth dielectric layer, while the second dielectric layer is the thinnest among the dielectric layer, the fourth dielectric layer and the fifth dielectric layer;
wherein a cover layer is disposed on the fourth dielectric layer, covering a plurality of electrical contact pads of the plurality of first circuit layers, provided with a plurality of openings exposing portions of a surface of each electrical contact pad, a plurality of conductive bumps are disposed within openings and encapsulated by an underfill;
an electronic element disposed on the cover layer in the groove and electrically connected to the plurality of electrical contact pads via the plurality of conductive bumps;
a cladding layer formed on the cover layer and encapsulating the electronic element;
a first insulating protective layer disposed on the third dielectric layer and partially embedded by the plurality of first circuit layers of the third dielectric layer; wherein the first insulating protective layer comprises a plurality of first apertures exposing the plurality of first circuit layers of the third dielectric layer, and a plurality of conductive elements are disposed within the first apertures, the plurality of second circuit layers are electrically connected to the plurality of first circuit layers of the third dielectric layer via the conductive elements;
wherein the groove corresponds to the cover layer and extends from the first insulating protective layer to the cover layer, and an upper surface of the cladding layer is flush with the surface of the first insulating protective layer;
a second insulating protective layer disposed on the second dielectric layer, comprising a plurality of second apertures exposing the plurality of second circuit layers; and
a third insulating protective layer disposed on the fifth dielectric layer, comprising a plurality of third apertures exposing the plurality of first circuit layers of the fifth dielectric layer.

2. A method of fabricating an electronic package, comprising:
providing a coreless circuit structure, wherein the coreless circuit structure has a first side and a second side opposing the first side, and a groove defined on the second side, wherein the circuit structure comprises a plurality of first dielectric layers with a plurality of first circuit layers;
configuring and disposing an external connection structure on the second side of the coreless circuit structure, wherein the external connection structure comprises a second dielectric layer with a plurality of second circuit layers;
wherein the plurality of first dielectric layers comprises a third dielectric layer on the second side, a fourth dielectric layer, and a fifth dielectric layer on the first side, which are sequentially bonded; among the second, third, fourth, and fifth dielectric layers, the third dielectric layer is the thickest, while the second dielectric layer is the thinnest;
wherein a cover layer is disposed on the fourth dielectric layer, covering a plurality of electrical contact pads of the plurality of first circuit layers, provided with a plurality of openings exposing portions of a surface of each electrical contact pad, a plurality of conductive bumps are disposed within openings and encapsulated by an underfill;
disposing an electronic element on the cover layer in the groove to electrically connect to the plurality of electrical contact pads via the plurality of conductive bumps;
forming a cladding layer on the cover layer to encapsulate the electronic element;

disposing a first insulating protective layer on the third dielectric layer, the first insulating protective layer is partially embedded by the plurality of first circuit layers of the third dielectric layer; wherein the first insulating protective layer comprises a plurality of first apertures exposing the plurality of first circuit layers of the third dielectric layer, and a plurality of conductive elements are disposed within the first apertures, the plurality of second circuit layers are electrically connected to the plurality of first circuit layers of the third dielectric layer via the conductive elements;

wherein the groove corresponds to the cover layer and extends from the first insulating protective layer to the cover layer, and an upper surface of the cladding layer is flush with the surface of the first insulating protective layer;

disposing a second insulating protective layer on the second dielectric layer, and the second insulating protective layer comprises a plurality of second apertures exposing the plurality of second circuit layers; and disposing a third insulating protective layer disposed on the fifth dielectric layer, and the second insulating protective layer comprises a plurality of third apertures exposing the plurality of first circuit layers of the fifth dielectric layer.

* * * * *